United States Patent
Schumi

(10) Patent No.: US 11,171,646 B1
(45) Date of Patent: Nov. 9, 2021

(54) TURN-OFF DETECTION CIRCUITS FOR ANTI-SERIES SWITCHES

(71) Applicant: Infineon Technologies AG, Neubiberg (DE)

(72) Inventor: Stefan Schumi, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/149,506

(22) Filed: Jan. 14, 2021

(51) Int. Cl.
*H03B 1/00* (2006.01)
*H03K 3/00* (2006.01)
*H03K 17/687* (2006.01)

(52) U.S. Cl.
CPC .................. *H03K 17/6871* (2013.01)

(58) Field of Classification Search
CPC ................................................ H03K 17/6871
See application file for complete search history.

(56) References Cited

U.S. PATENT DOCUMENTS

| 5,574,385 A | 11/1996 | Murphy et al. |
| 9,973,134 B1 | 5/2018 | Namuduri et al. |
| 2007/0127182 A1 | 6/2007 | Chang et al. |
| 2013/0162030 A1 | 6/2013 | Sonesson et al. |
| 2019/0393563 A1 | 12/2019 | Chinen |
| 2020/0099176 A1* | 3/2020 | Mourrier ............ H02J 7/00306 |
| 2020/0339050 A1 | 10/2020 | Woerner |

FOREIGN PATENT DOCUMENTS

DE    102018205850    10/2019

* cited by examiner

*Primary Examiner* — Metasebia T Retebo
(74) *Attorney, Agent, or Firm* — Shumaker & Sieffert, P.A.

(57) ABSTRACT

In some examples, a circuit is configured to control an anti-series switch comprising a first transistor and a second transistor coupled in an anti-series configuration. The circuit comprises one or more driver circuits configured to control gates of the first transistor and the second transistor, and a detection circuit configured to detect whether both the first transistor and the second transistor are in an OFF state. The detection circuit is configured to deliver a signal to the anti-series switch, detect the signal in the anti-series switch, and determine whether the both the first transistor and the second transistor are in an OFF state based on the detected signal.

18 Claims, 5 Drawing Sheets

TURN-OFF DETECTION CIRCUITS FOR ANTI-SERIES SWITCHES

TECHNICAL FIELD

This disclosure relates to anti-series switches that include two transistors arranged in an anti-series configuration, and more specifically, to circuits that are configured to control anti-series switches.

BACKGROUND

Anti-series switches are used in a wide variety of circuits and devices. Anti-series switches comprise two transistors coupled to one another in an anti-series configuration. In some cases, an anti-series switch may comprise two different transistors with the source node of each transistor coupled to the source node of the other transistor. In other cases, an anti-series switch may comprise two different transistors with the drain node of each transistor coupled to the drain node of the other transistor.

Anti-series switches are commonly coupled to two or more power sources in order to control power delivery from the two or more power sources. Moreover, anti-series switches are often used in settings where electrical safety is a concern. For example, anti-series switches may be used in electric vehicles, self-driving vehicles, or other settings where an electrical short or electrical failure can result in safety concerns.

SUMMARY

In general, this disclosure is directed to circuits used for controlling anti-series switches. The circuits may be configured to detect and confirm whether both transistors of an anti-series switch are in an OFF state. A driver circuit may be configured to control the gates of the two transistors of an anti-series switch to control ON/OFF switching of the two transistors. The techniques and circuits of this disclosure may perform additional steps in order to actively check or confirm whether both transistors in an OFF state, which may be desirable for safety reasons. For example, detection circuitry (which may be part of the gate driver circuitry or may be a separate circuit) may be configured to deliver a signal to the anti-series switch, detect the signal in the anti-series switch, and determine whether the both the first transistor and the second transistor are in the OFF state based on the detected signal. The circuits and techniques may be useful for applications where safety is of paramount concern, such as for circuits within self-driving vehicles, or circuits within other types of automated machines.

In one example, a circuit configured to control an anti-series switch comprising a first transistor and a second transistor coupled in an anti-series configuration. The circuit may comprise one or more driver circuits configured to control gates of the first transistor and the second transistor, and a detection circuit configured to detect whether both the first transistor and the second transistor are in an OFF state. The detection circuit may be configured to deliver a signal to the anti-series switch, detect the signal in the anti-series switch, and determine whether the both the first transistor and the second transistor are in the OFF state based on the detected signal.

In another examples, a method is described for controlling an anti-series switch comprising a first transistor and a second transistor coupled in an anti-series configuration. The method may comprise detecting whether both the first transistor and the second transistor are in an OFF state. Moreover, detecting whether both the first transistor and the second transistor are in an OFF state may include delivering a signal to the anti-series switch, detecting the signal in the anti-series switch, and determining whether the both the first transistor and the second transistor are in the OFF state based on the detected signal.

In another example, a device may comprise an anti-series switch that includes a first transistor and a second transistor coupled in an anti-series configuration. The device may further include one or more driver circuits configured to control gates of the first transistor and the second transistor, and a detection circuit configured to detect whether both the first transistor and the second transistor are in an OFF state. The detection circuit may be configured to deliver a signal to the anti-series switch, detect the signal in the anti-series switch, and determine whether the both the first transistor and the second transistor are in the OFF state based on the detected signal.

Details of these and other examples are set forth in the accompanying drawings and the description below. Other features, objects, and advantages will be apparent from the description and drawings, and from the claims.

DETAILED DESCRIPTION

This disclosure is directed to circuits used for controlling anti-series switches. The circuits and techniques described herein may be especially useful for applications where safety is of paramount concern, such as for circuits within self-driving vehicles, or circuits within other types of automated machines. Vehicles and other machines, for example, are becoming more automated, and may be capable of some operation without human control. A faulty switch, however, can cause problems in the operation of automated device (as well as with non-automated devices). The circuits and techniques of this disclosure may achieve a higher level of safety than conventional circuits, in the operation of anti-series switches, which may be used in a wide variety of applications and settings. The circuits and techniques of this disclosure may implement an active process to check and confirm the OFF state of both transistors of an anti-series switch, which may be desirable to promote safety.

A driver circuit may be configured to control the gates of the two transistors of an anti-series switch to control ON/OFF switching of the two transistors. The techniques and circuits of this disclosure may perform additional steps in order to actively check or confirm whether both transistors in an OFF state. For example, detection circuitry (which may be part of the gate driver circuitry or may be a separate circuit) may be configured to deliver a signal to the anti-series switch, detect the signal in the anti-series switch, and determine whether the both the first transistor and the second transistor are in the OFF state based on the detected signal.

Figure 1:
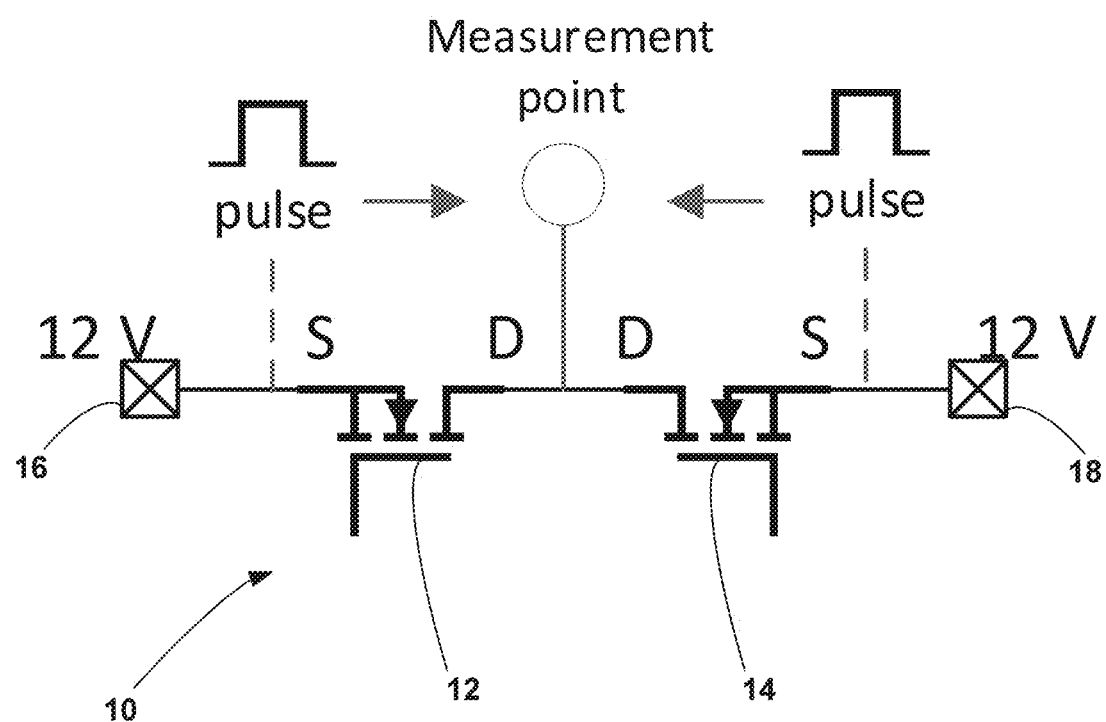
FIG. 1 is a circuit diagram of an anti-series switch, which functionally shows a process of delivering a signal and detecting the signal in the anti-series switch.

FIG. 1 is a circuit diagram of an anti-series switch 10 that comprises a first transistor 12 and a second transistor 14 connected in an anti-series configuration. In this example the drain terminals of first transistor 12 and second transistor 14 are connected to a common node. Anti-series switch 10 may further comprise terminals 16 and 18, which may be configured for connection to different battery sources (e.g., in this case, two different 12V sources).

One or more driver circuits (not shown in FIG. 1) may be configured to control the ON/OFF states of first transistor 12 and second transistor 14 by controlling the voltages applied to the gates of transistors 12, 14. However, gate control may be incapable of confirming whether both transistors are in an OFF state, even if the voltages applied to the gates of transistors 12, 14 correspond to the OFF state. Therefore, according to this disclosure, detection circuit (not shown in FIG. 1) may be configured to detect or confirm whether both first transistor 12 and second transistor 14 are in an OFF state. The detection circuit, for example, may deliver a signal to the anti-series switch (e.g., one or more "Pulses" as shown in FIG. 1), and may detect the signal in the anti-series switch (e.g., at a measurement point shown in FIG. 1). Based on the detected signal, the detection circuit may determine whether both first transistor 12 and second transistor 14 are in the OFF state. In some examples, the detection circuitry may provide redundancy in determining or confirming the OFF state of both first transistor 12 and second transistor 14, after one or more driver circuits have applied voltages to the gates of transistors 12, 14 that should correspond to the OFF state of transistors 12, 14.

Figures 2A, 2B:
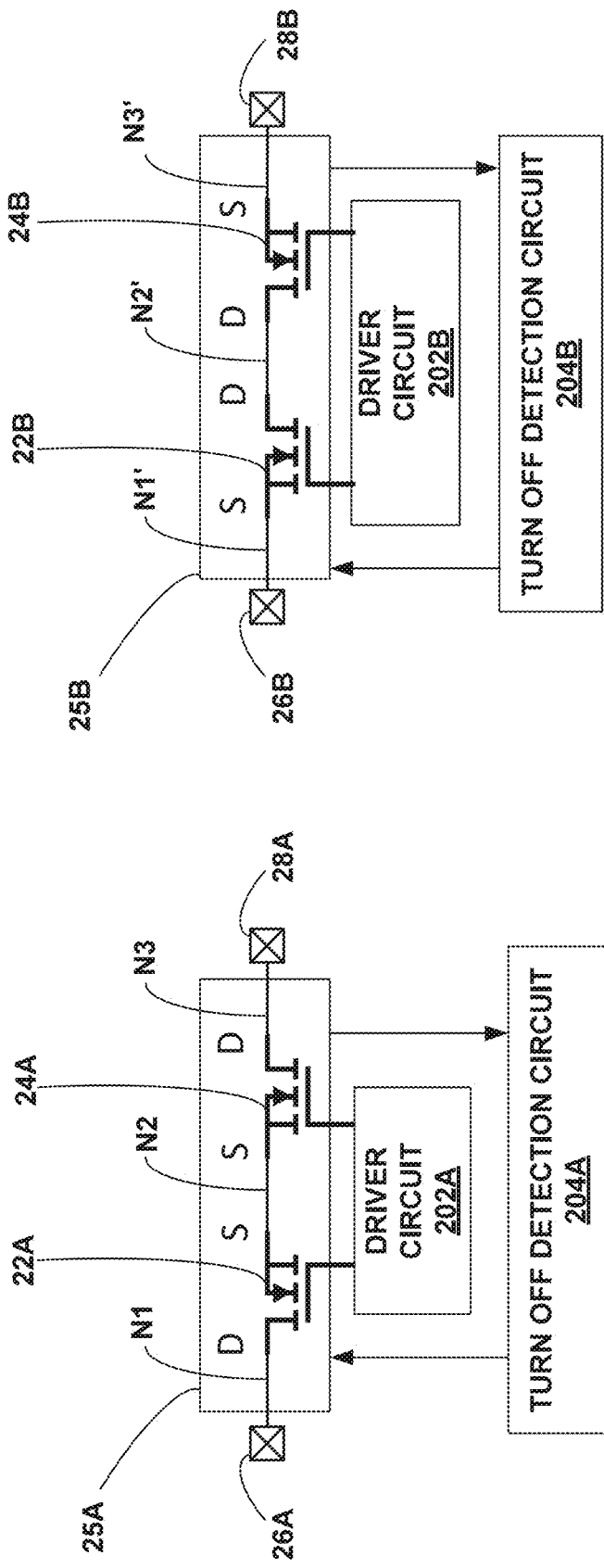
FIGS. 2A and 2B are block diagrams showing an anti-series switch, a driver, and a turn-off detecting circuit.

FIGS. 2A and 2B are block diagrams showing two different examples of an anti-series switch, a driver, and a turn-off detecting circuit. In FIG. 2A, anti-series switch 25A comprises a first transistor 22A and a second transistor 24A with source terminals connected at Node N2. A first terminal 26A of anti-series switch 25A is connected to a drain terminal of first transistor 22A and a second terminal 28A of anti-series switch 25A is connected to a drain terminal of second transistor 24A. Different batteries or other power supplies may be connected to terminals 26A and 28A. A driver circuit 202A is configured to control the voltages applied to the gates of transistors 22A, 24A in order to control the ON/OFF switching of transistors 22A, 24A. Furthermore, turn off detection circuit 204A may be configured to detect or confirm the OFF state of transistors 22A, 24A. In particular, turn off detection circuit 204A may be configured to deliver a signal to the anti-series switch 25A, detect the signal in anti-series switch 25A, and determine whether both first transistor 22A and second transistor 24A are in the OFF state based on the detected signal.

In some examples, turn of detection circuit 204A and driver circuit 202A may use common circuit elements. In other words, turn of detection circuit 204A may use one or more components of driver circuit 202A (such as capacitors of a DC/DC converter) when performing a turn off detection process.

In the example of FIG. 2B, anti-series switch 25B comprises a first transistor 22B and a second transistor 24B with drain terminals connected at Node N2'. A first terminal 26B of anti-series switch 25B is connected to a source terminal of first transistor 22B and a second terminal 28B of anti-series switch 25B is connected to a source terminal of second transistor 24B. Similar to FIG. 2A, with FIG. 2B, different batteries or other power supplies may be connected to terminals 26B and 28B. A driver circuit 202B is configured to control the voltages applied to the gates of transistors 22B, 24B in order to control the ON/OFF switching of transistors 22B, 2BB. Furthermore, turn off detection circuit 204B may be configured to deliver a signal to the anti-series switch 25B, detect the signal in anti-series switch 25B, and determine (e.g., confirm) whether both first transistor 22B and second transistor 24B are in the OFF state based on the detected signal. In this manner, turn off detection circuit 204B may be configured to detect or confirm the OFF state of transistors 22B, 24B.

FIGS. 2A and 2B will now be described together. Anti-series switch 25 collectively refers to anti-series switch 25A or 25B, driver circuit 202 refers to driver circuit 202A or 202B, and turn-off detection circuit 204 refers to circuit 204A or 204B. Similarly, terminal 26 refers to terminal 26A or 26B, terminal 28 refers to terminal 28A or 28B, first transistor 22 refers to first transistor 22A or 22B, and second transistor 24 refers to second transistor 24A or 24B.

Turn off detection circuit 204 may be configured to deliver a signal to the anti-series switch 25, detect the signal in anti-series switch 25, and determine (e.g., confirm) whether both first transistor 22 and second transistor 24 are in the OFF state based on the detected signal. The location for delivery of the signal to anti-series switch 25, and the location for detecting the signal in anti-series switch 25 may be different in different configurations and may depend upon the orientation of body diodes within first transistor 22 and second transistor 24. In some examples, the signal is delivered to Node N2 or N2' and the signal is also detected at Node N2 or N2'. In this case, if first transistor 22 and second transistor 24 are stuck in an ON state, then the signal delivered to Node N2 or N2' may dissipate through the open transistor, and the signal detected at Node N2 or N2' may be indicative of this dissipation. Accordingly, by delivering a signal to Node N2 or N2', and detecting the signal at Node N2 or N2', turn off detection circuit 204 can confirm whether or not first transistor 22 and second transistor 24 are in the OFF state.

In other examples, however, turn-off detection circuit 204 may deliver the signal to one node (e.g., N1, N2, or N3) (e.g., N1', N2', or N3'), and may detect the signal within anti-series switch 25 at a different node (e.g., N1, N2, or N3) (e.g., N1', N2', or N3'). This type of deliver and detection may be useful for some situations, depending on the configuration of body diodes within first transistor 22 and second transistor 25.

First transistor 22 and second transistor 25 may comprise metal oxide field effect transistors (MOSFET) or any other types of transistors that have charge-injected gate control. Turn-off detection circuit 204 may comprise an RC circuit configured to deliver the signal to the anti-series switch 25, and in some cases, turn-off detection circuit 204 may comprise a DC/DC power converter configured to deliver the signal to the anti-series switch 25. Furthermore, in some examples, the DC/DC converter is part of driver circuit 202, wherein detection circuit 204 is configured to deliver the signal to the anti-series switch 25 based on a supply voltage used to supply driver circuit 202 and based on an additional voltage. Accordingly, in some examples, at least some of turn-off detection circuit 204 is part of driver circuit 202.

Detection circuit 204 may comprise a comparator configured to detect the signal in anti-series switch 205, or alternatively, detection circuit 204 may further comprise an analog-to-digital converter (ADC) configured to detect the signal in the anti-series switch. In some examples, detection circuit 204 may issue an alert back to a system-level microcontroller or to a power management controller, upon detecting that anti-series switch 25 is not in an OFF state, which may indicate a problem.

As mentioned, in some examples, turn-off detection circuit 204 comprises an RC circuit configured to deliver the signal to anti-series switch 25. Consistent with this implementation, in some cases the RC circuit comprises an output capacitor of a DC/DC converter associated with driver circuit 202 and an additional resistor. Turn-off detection circuit 204 may further comprise two additional transistors configured to connect and disconnect the RC circuit to node N2 or N2' positioned between first transistor 22 and second transistor 24.

Figure 3:
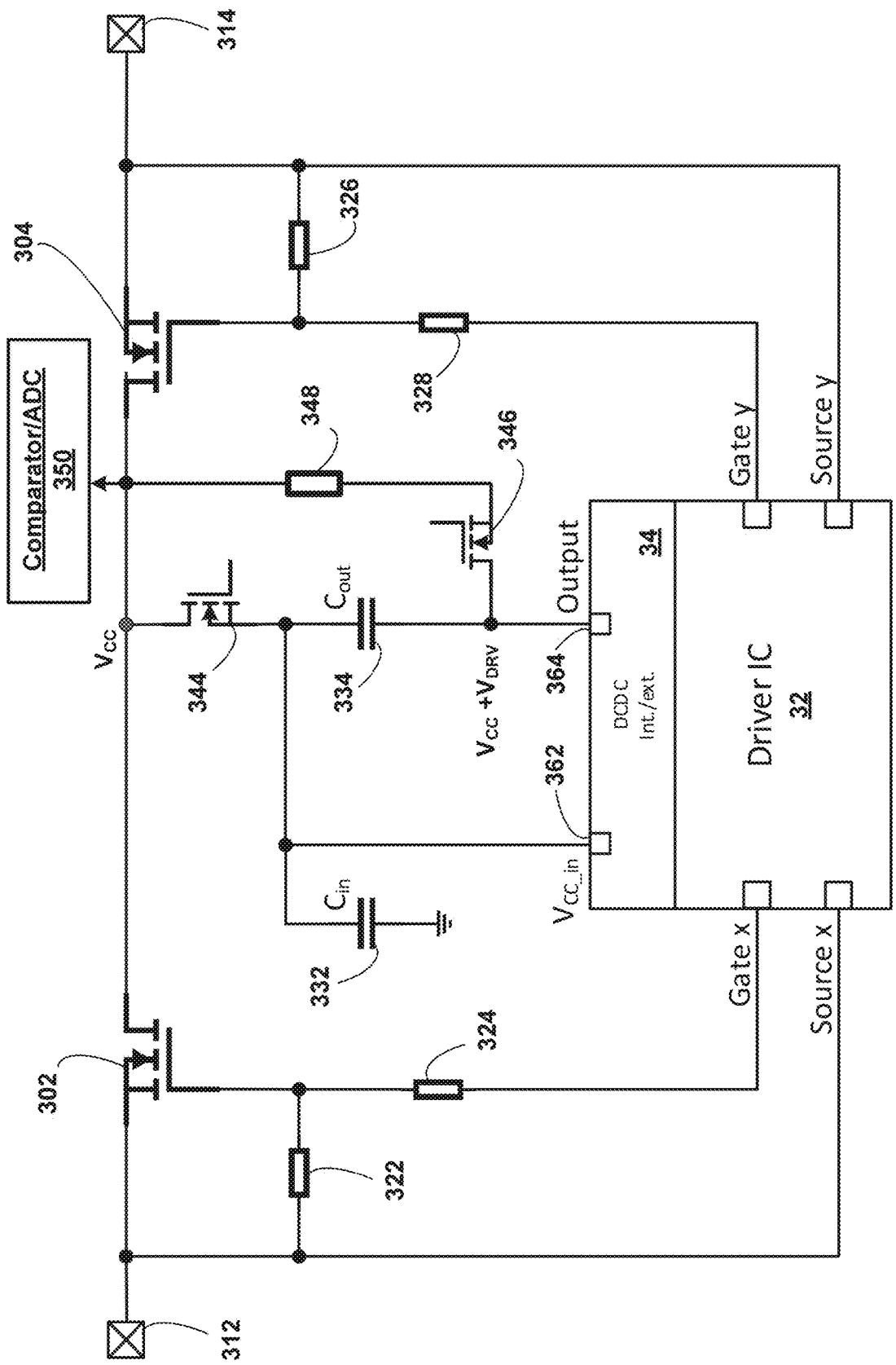
FIG. 3 is a block diagram showing a driver circuit that controls two transistors of an anti-series switch, and additional circuit elements that operate with components of the driver circuit to form a turn-off detecting circuit for the anti-series switch.

FIG. 3 shows a more detailed example of one particular implementation consistent with this disclosure. In particular, FIG. 3 is a block diagram showing a driver circuit (which may comprise driver IC 32 and additional components including an internal or external DC/DC power converter 34). The driver circuit controls two transistors 302, 304 of an anti-series switch. In addition, FIG. 3 shows additional circuit elements (e.g., transistors 334, 336 and resistor 348) that operate with components of the driver circuit to form a turn-off detecting circuit for the anti-series switch. Terminals 312 and 314 may define terminals of the anti-series switch, which may be coupled to different batteries or power sources.

The gate driver circuit within FIG. 3 may include driver IC 32 connected to the gate and the source terminals of first transistor 302. Driver IC 32 is similarly connected to the gate and the source terminals of second transistor 304, although it is also possible to use separate dedicated drivers for first and second transistors 302, 304. In the example of FIG. 3, resistor 324 is positioned between driver IC 32 and the gate of first transistor 302, and resistor 322 is positioned between the gate of first transistor 302 and the source of first transistor 302. Similarly, resistor 328 is positioned between driver IC 32 and the gate of second transistor 302, and resistor 326 is positioned between the gate of second transistor 302 and the second of first transistor 302.

The driver circuit may include a DC/DC converter 34, which may be internal to driver IC 32 or external to driver IC 32. In the example illustrated in FIG. 3, input and output capacitors 332 and 334 define the DC/DC power converter in an external configuration whereby output capacitor 334 is connected to output 364 and input capacitor 332 is connected to input 362. Input capacitor 332 may deliver a controlled input voltage to the driver circuit, which is shown as $V_{CC\_in}$ in FIG. 3.

During normal driver operation for controlling gates of transistors 302 and 304, transistor 344 is turned ON and transistor 346 is turned OFF. In this case, the voltage $V_{CC}$ at the node between transistors provides input supply voltage to the driver circuit at input terminal 362. According to this disclosure, in order to perform turn-off detection, transistor 344 is switched OFF and transistor 346 is switched ON, e.g., for a brief duration of time. This results in voltage $V_{CC}+V_{DRV}$ at output 364 which delivers current through resistor 348 to define a signal on the node between first transistor 302 and 304. Turn-off detection circuitry may include an element 350, which may comprise one or more comparators and/or one or more analog-to-digital converters capable of detecting the signal on the node between first transistor 302 and 304. In this way, turn-off detection circuitry may be configured to deliver a signal to an anti-series switch (e.g., to the node between transistors 302 and 304), detect the signal, and determine whether both transistors 302, 304 of the anti-series switch are in an OFF state based on the detected signal.

Figure 4:
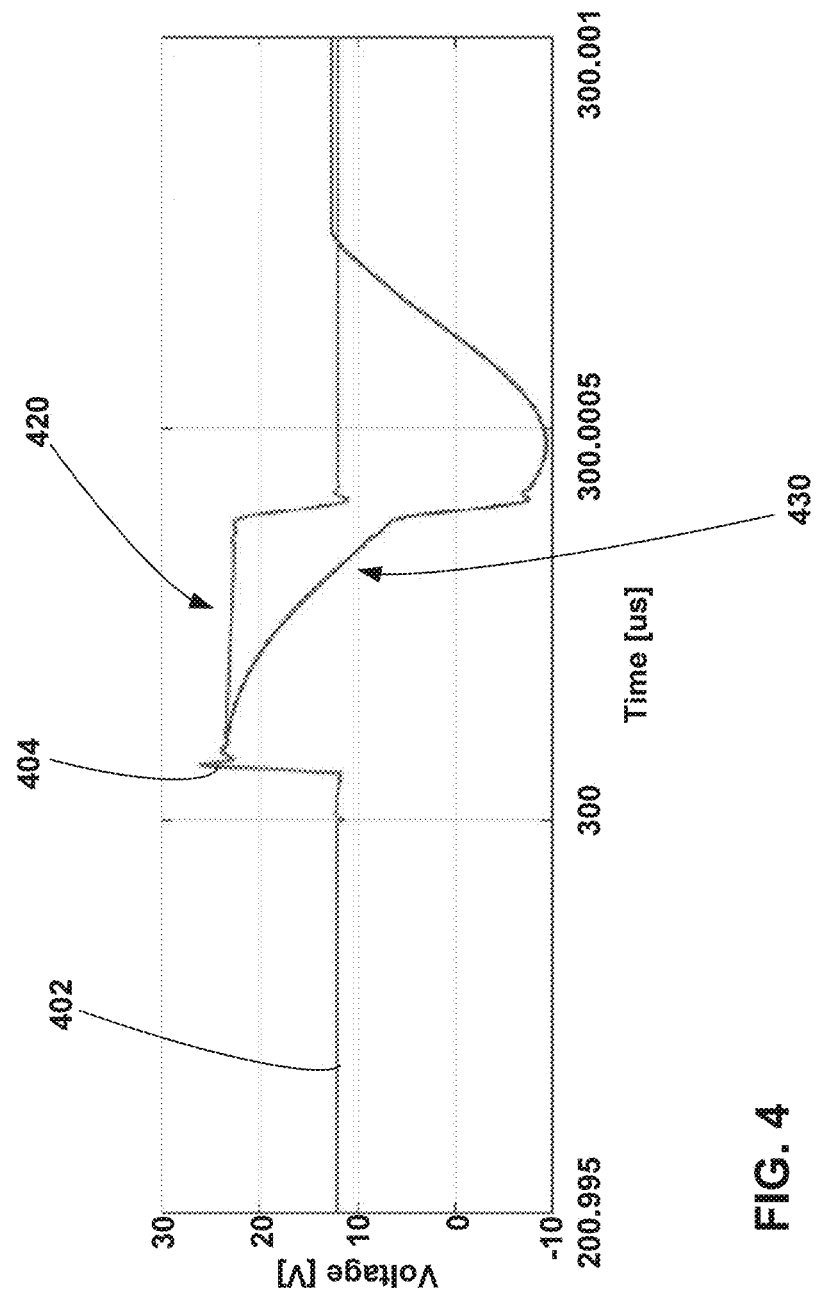
FIG. 4 is a graph demonstrating the delivery of a signal to an anti-series switch and the detection of two different signal responses in the anti-series switch that can be used to identify whether or not both transistors of the anti-series switch in in an OFF state.

FIG. 4 is a graph demonstrating the delivery of a signal to an anti-series switch and the detection of two different signal responses in the anti-series switch that can be used to identify whether or not both transistors of the anti-series switch in in an OFF state. FIG. 4 will be described from the perspective of the circuit shown in FIG. 3. As shown in FIG. 4, the node between transistors 302 and 304 may define a voltage corresponding to approximately 12 volts at time position 402. At time position 404, a signal is delivered to the node between transistors 302 and 304. In one example, to achieve this signal at the node between transistors 302 and 304, transistor 344 is switched OFF and transistor 346 is switched ON. This results in voltage $V_{CC}+V_{DRV}$ at output 364 which delivers current through resistor 348 to define a signal on the node between first transistor 302 and 304.

Element 350, which may comprise one or more comparators and/or one or more analog-to-digital converters, is capable of detecting the signal on the node between first transistor 302 and 304. As shown in FIG. 4, if the measured signal on the node between first transistor 302 and 304 looks similar to signal 420, then this may indicate faulted operation of the anti-series switch. Signal 420, for example, maintains a voltage similar to that delivered at time position 404, which is substantially higher than the voltage at time position 402, while the signal is being delivered by the turn-off detection circuitry over a time period that is less than approximately 0.001 milliseconds. For example, signal 420 may be delivered for a time period that is between approximately 0.001 and 0.0001 milliseconds.

Alternatively, shown in FIG. 4, if the measured signal on the node between first transistor 302 and 304 of FIG. 3 looks similar to signal 430 shown in FIG. 4, then this may indicate a normal operational state of the anti-series switch. Instead of maintaining a step-up in voltage shown in signal 420, in signal 430 there is a relatively fast voltage drop. Element 350 (FIG. 3) is able to detect the difference between signal 420 or signal 430 (shown in FIG. 4) in order to identify whether or not both transistors 302, 304 of an anti-series switch are in an OFF state. If not (e.g., if signal 420 is detected), then element 350 (FIG. 3) may issue a fault signal back to a system-level microcontroller, power management system, or power controller. Such a fault, for example, may result in corrective or protective action at the system level, such as by disabling or limiting automated futures within the system. If used in a self-driving vehicle, for example, the fault condition may result in suspension of one or more self-driving features, and possibly alerting a driver that such self-driving features are unavailable.

Figure 5:
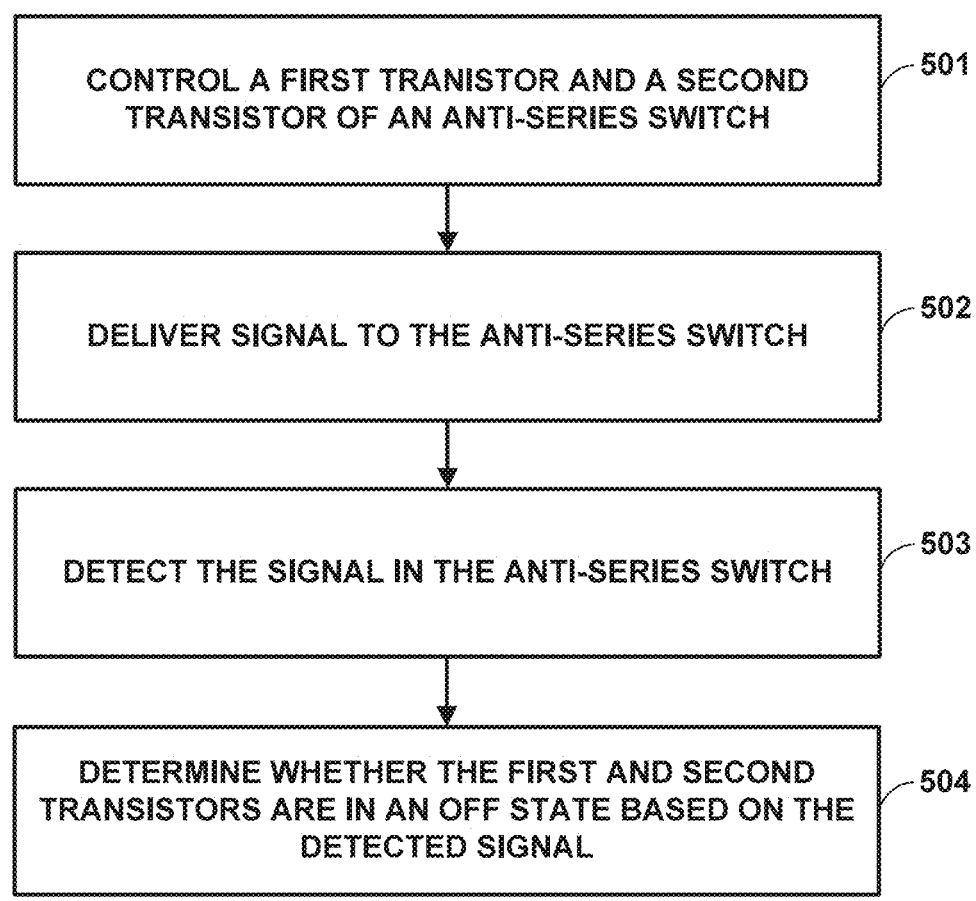
FIG. 5 is a flow diagram consistent with techniques according to this disclosure.

FIG. 5 is a flow diagram consistent with techniques according to this disclosure. FIG. 5 will be described from the perspective of circuits shown in FIG. 2A or 2B. As shown in FIG. 5, a driver circuit 202 controls a first transistor 22 and a second transistor 24 of an anti-series switch 25 (501). In particular, driver circuit 202 may control ON/OFF states of first transistor 22 and second transistor 24 by controlling voltages applied to the gates of transistors 22, 24.

Turn off detection circuit 204 delivers a signal to the anti-series switch 25 (502), detect the signal in anti-series switch 25 (503), and determine (e.g., confirm) whether both first transistor 22 and second transistor 24 are in the OFF state based on the detected signal (504). The location for delivery of the signal to anti-series switch 25, and the location for detecting the signal in anti-series switch 25 may be different in different configurations and may depend upon the orientation of body diodes within first transistor 22 and second transistor 24. In some examples, the signal is delivered to Node N2 or N2' and the signal is also detected at Node N2 or N2'. In this case, if first transistor 22 and second transistor 24 are stuck in an ON state, then the signal delivered to Node N2 or N2' may look similar to signal 420 of FIG. 4. Accordingly, by delivering a signal to Node N2 or N2', and detecting the signal at Node N2 or N2', turn off detection circuit 204 can confirm whether or not first transistor 22 and second transistor 24 are in the OFF state by detecting signal 430 shown in FIG. 4 (indicating normal operation with both transistors in OFF state) or signal 420 shown in FIG. 4 (indicating a fault in anti-series switch 25).

In some examples, delivering the signal (502) may comprise delivering the signal to the anti-series switch via a DC/DC converter, wherein the DC/DC converter is part of the one or more driver circuits 202. Furthermore, in some examples, delivering the signal (502) may comprise delivering the signal to the anti-series switch via an RC circuit. In this example, the capacitor of the RC circuit may comprise an output capacitor of a DC/DC converter, wherein the DC/DC converter is part of one or more driver circuits 202 that are configured to control first transistor 22 and second transistor 24. Also, delivering a signal (502) may comprise connecting the RC circuit to a node positioned between first transistor 22 and second transistor 24. The example circuit shown in FIG. 3 is one example that uses an RC circuit comprising an output capacitor of a DC/DC converter, wherein the DC/DC converter is part of one or more driver circuits that are configured to control first transistor 302 and second transistor 304.

In some cases, after determining whether the first and second transistors are in an OFF state based on the detected signal (504), detection circuitry of this disclosure may be further configured to perform additional steps if one or both of the first and second transistors are NOT in the OFF state. For example, element 350 of FIG. 3 may be further configured to generate a fault signal in response to determining that one or both of first transistor 302 and second transistor 304 are NOT in the OFF state. Element 350 may be capable of detecting the difference between signal 420 or signal 430 to identify whether or not both transistors 302, 304 of an anti-series switch are in an OFF state. If not (e.g., if signal 420 is detected), then element 350 may issue a fault signal back to a system-level microcontroller, power management system, or power controller. Such a fault, for example, may result in corrective or protective action at the system level, such as by disabling or limiting automated features within the system. If used in a self-driving vehicle, for example, the fault condition may result in suspension of one or more self-driving features, and possibly alerting a driver that such self-driving features are unavailable.

The following clauses may illustrate one or more aspects of the disclosure.

Clause 1: A circuit configured to control an anti-series switch comprising a first transistor and a second transistor coupled in an anti-series configuration, the circuit comprising: one or more driver circuits configured to control gates of the first transistor and the second transistor; and a detection circuit configured to detect whether both the first transistor and the second transistor are in an OFF state, wherein the detection circuit is configured to deliver a signal to the anti-series switch, detect the signal in the anti-series switch, and determine whether the both the first transistor and the second transistor are in the OFF state based on the detected signal.

Clause 2: The circuit of clause 1, wherein the first transistor and the second transistor comprise metal oxide field effect transistors.

Clause 3: The circuit of clause 1 or 2, wherein at least some of the detection circuit is part of the one or more driver circuits.

Clause 4: The circuit of any of clauses 1-3, wherein the detection circuit is configured to deliver the signal to a node positioned between the first transistor and the second transistor and the detection circuit is configured to detect the signal at the node.

Clause 5: The circuit of any of clauses 1-4, wherein the detection circuit comprises a comparator configured to detect the signal in the anti-series switch.

Clause 6: The circuit of any of clauses 1-4, wherein the detection circuit comprises an analog-to-digital converter (ADC) configured to detect the signal in the anti-series switch.

Clause 7: The circuit of any of clauses 1-6, wherein the detection circuit comprises a DC/DC converter configured to deliver the signal to the anti-series switch.

Clause 8: The circuit of clause 7, wherein the DC/DC converter is part of the one or more driver circuits, wherein the detection circuit is configured to deliver the signal to the anti-series switch based on a supply voltage used to supply the one or more driver circuits and an additional voltage.

Clause 9: The circuit of any of clauses 1-8, wherein the detection circuit comprises an RC circuit configured to deliver the signal to the anti-series switch.

Clause 10: The circuit of clause 9, wherein the RC circuit comprises a capacitor and a resistor, and wherein the capacitor comprises an output capacitor of a DC/DC converter.

Clause 11: The circuit of clause 10, wherein the DC/DC converter is part of the one or more driver circuits.

Clause 12: The circuit of any of clauses 9-11, wherein the detection circuit further comprises two transistors configured to connect and disconnect the RC circuit to a node positioned between the first transistor and the second transistor.

Clause 13: A method of controlling an anti-series switch comprising a first transistor and a second transistor coupled in an anti-series configuration, the method comprising: detecting whether both the first transistor and the second transistor are in an OFF state, wherein detecting includes: delivering a signal to the anti-series switch, detecting the signal in the anti-series switch, and determining whether the both the first transistor and the second transistor are in the OFF state based on the detected signal.

Clause 14: The method of clause 13, further comprising: controlling states of the first transistor and the second transistor via one or more driver circuits.

Clause 15: The method of clause 14, further comprising delivering the signal to the anti-series switch via a DC/DC converter, wherein the DC/DC converter is part of the one or more driver circuits.

Clause 16: The method of any of clauses 13-15, further comprising delivering the signal to the anti-series switch via an RC circuit.

Clause 17: The method of clause 16, wherein a capacitor of the RC circuit comprises an output capacitor of a DC/DC converter and wherein the DC/DC converter is part of one or more driver circuits that are configured to control the first transistor and the second transistor.

Clause 18: The method of clause 16 or 17, wherein delivering a signal to the anti-series switch comprises connecting the RC circuit to a node positioned between the first transistor and the second transistor.

Clause 19: The method of any of clauses 13-18, further comprising generating a fault signal in response to determining that one or both of the first transistor and the second transistor are NOT in the OFF state.

Clause 20: A device comprising: an anti-series switch comprising a first transistor and a second transistor coupled in an anti-series configuration; one or more driver circuits configured to control gates of the first transistor and the second transistor; and a detection circuit configured to detect whether both the first transistor and the second transistor are in an OFF state, wherein the detection circuit is configured to deliver a signal to the anti-series switch, detect the signal in the anti-series switch, and determine whether the both the first transistor and the second transistor are in the OFF state based on the detected signal.

Various aspects have been described in this disclosure. These and other aspects are within the scope of the following claims.

The invention claimed is:

1. A circuit configured to control an anti-series switch comprising a first transistor and a second transistor coupled in an anti-series configuration, the circuit comprising:
one or more driver circuits configured to control gates of the first transistor and the second transistor; and
a detection circuit configured to detect whether both the first transistor and the second transistor are in an OFF state, wherein the detection circuit is configured to deliver a signal to the anti-series switch, detect the signal in the anti-series switch, and determine whether the both the first transistor and the second transistor are in the OFF state based on the detected signal, and wherein the detection circuit comprises a DC/DC converter configured to deliver the signal to the anti-series switch.

2. The circuit of claim 1, wherein the first transistor and the second transistor comprise metal oxide field effect transistors.

3. The circuit of claim 1, wherein at least some of the detection circuit is part of the one or more driver circuits.

4. The circuit of claim 1, wherein the detection circuit is configured to deliver the signal to a node positioned between the first transistor and the second transistor and the detection circuit is configured to detect the signal at the node.

5. The circuit of claim 1, wherein the detection circuit comprises a comparator configured to detect the signal in the anti-series switch.

6. The circuit of claim 1, wherein the detection circuit comprises an analog-to-digital converter (ADC) configured to detect the signal in the anti-series switch.

7. The circuit of claim 1, wherein the DC/DC converter of the detection circuit is part of the one or more driver circuits, wherein the detection circuit is configured to deliver the signal to the anti-series switch based on a supply voltage used to supply the one or more driver circuits and an additional voltage.

8. A circuit configured to control an anti-series switch comprising a first transistor and a second transistor coupled in an anti-series configuration, the circuit comprising:
one or more driver circuits configured to control gates of the first transistor and the second transistor; and
a detection circuit configured to detect whether both the first transistor and the second transistor are in an OFF state, wherein the detection circuit is configured to deliver a signal to the anti-series switch, detect the signal in the anti-series switch, and determine whether the both the first transistor and the second transistor are in the OFF state based on the detected signal, wherein the detection circuit comprises an RC circuit configured to deliver the signal to the anti-series switch, and wherein the RC circuit comprises a capacitor and a resistor, and wherein the capacitor comprises an output capacitor of a DC/DC converter.

9. The circuit of claim 8, wherein the DC/DC converter is part of the one or more driver circuits.

10. The circuit of claim 9, wherein the detection circuit further comprises two transistors configured to connect and disconnect the RC circuit to a node positioned between the first transistor and the second transistor.

11. A method of controlling an anti-series switch comprising a first transistor and a second transistor coupled in an anti-series configuration, the method comprising:
detecting whether both the first transistor and the second transistor are in an OFF state, wherein detecting includes:
delivering a signal to the anti-series switch via an RC circuit, wherein delivering the signal to the anti-series switch comprises connecting the RC circuit to a node positioned between the first transistor and the second transistor,
detecting the signal in the anti-series switch, and
determining whether the both the first transistor and the second transistor are in the OFF state based on the detected signal.

12. The method of claim 11, further comprising:
controlling states of the first transistor and the second transistor via one or more driver circuits.

13. The method of claim 12, wherein a DC/DC converter is part of the one or more driver circuits and wherein the RC circuit comprises an output capacitor of the DC/DC converter and an additional resistor.

14. The method of claim 11, wherein a capacitor of the RC circuit comprises an output capacitor of a DC/DC converter and wherein the DC/DC converter is part of one or more driver circuits that are configured to control the first transistor and the second transistor.

15. The method of claim 11, further comprising generating a fault signal in response to determining that one or both of the first transistor and the second transistor are not in the OFF state.

16. A device comprising:
an anti-series switch comprising a first transistor and a second transistor coupled in an anti-series configuration;
one or more driver circuits configured to control gates of the first transistor and the second transistor; and
a detection circuit configured to detect whether both the first transistor and the second transistor are in an OFF state, wherein the detection circuit is configured to deliver a signal to the anti-series switch, detect the signal in the anti-series switch, and determine whether the both the first transistor and the second transistor are in the OFF state based on the detected signal, and wherein the detection circuit comprises a DC/DC converter configured to deliver the signal to the anti-series switch.

17. A circuit configured to control an anti-series switch comprising a first transistor and a second transistor coupled in an anti-series configuration, the circuit comprising:
one or more driver circuits configured to control gates of the first transistor and the second transistor; and a detection circuit that includes an RC circuit, wherein the detection circuit is configured to detect whether both the first transistor and the second transistor are in an OFF state, wherein the detection circuit is configured to deliver a signal to the anti-series switch, detect the signal in the anti-series switch, and determine whether the both the first transistor and the second transistor are in the OFF state based on the detected signal, wherein the detection circuit is configured to deliver the signal to the anti-series switch via the RC circuit, wherein delivering the signal to the anti-series switch comprises connecting the RC circuit to a node positioned between the first transistor and the second transistor.

18. The circuit of claim 17, wherein the RC circuit comprises a resistor and a capacitor, wherein the capacitor of the RC circuit comprises an output capacitor of a DC/DC converter associated with the one or more driver circuits.

\* \* \* \* \*